United States Patent
de la Torre (12)

(10) Patent No.: US 7,362,151 B2
(45) Date of Patent: Apr. 22, 2008

(54) TIMING CIRCUITS WITH IMPROVED POWER SUPPLY JITTER ISOLATION TECHNICAL BACKGROUND

(75) Inventor: Luis de la Torre, Daganzo de Arriba (ES)

(73) Assignee: Agere Systems Inc., Allentown, PA (US)

( * ) Notice: Subject to any disclaimer, the term of this patent is extended or adjusted under 35 U.S.C. 154(b) by 184 days.

(21) Appl. No.: 11/260,805

(22) Filed: Oct. 27, 2005

(65) Prior Publication Data

US 2007/0096783 A1    May 3, 2007

(51) Int. Cl.
*H03L 7/06* (2006.01)
(52) U.S. Cl. .................. 327/156; 327/147; 327/158
(58) Field of Classification Search ........ 327/147–150, 327/156–160, 362
See application file for complete search history.

(56) References Cited

U.S. PATENT DOCUMENTS

| 6,246,294 | B1 * | 6/2001 | Gai .............................. 331/57 |
| 6,476,656 | B2 * | 11/2002 | Dally et al. ................. 327/276 |
| 6,603,340 | B2 * | 8/2003 | Tachimori ................... 327/262 |
| 6,882,580 | B2 * | 4/2005 | Lim et al. .............. 365/189.05 |
| 6,888,417 | B2 * | 5/2005 | Moon et al. .................. 331/75 |
| 7,203,260 | B2 * | 4/2007 | Moon et al. ................ 375/355 |

\* cited by examiner

*Primary Examiner*—Dinh T. Le (57) ABSTRACT

In accordance with the invention, feed forward compensation of jitter induced by power supply noise is incorporated into the negative feedback control loop of a timing synchronization circuit, such as a phase locked loop or delay locked loop. More particularly, the dependence of the circuitry in the negative feedback loop, such as the delay elements in a DLL or the oscillator in a PLL, to fluctuations in the power supply are counteracted by introducing into the feedback loop a signal component that is a function of the supply voltage and that will have the opposite effect from any direct fluctuations in the power supply voltage.

16 Claims, 6 Drawing Sheets

PRIOR ART

TIMING CIRCUITS WITH IMPROVED POWER SUPPLY JITTER ISOLATION TECHNICAL BACKGROUND

TECHNICAL BACKGROUND

1. Field of the Invention

The invention pertains to timing circuits such as phase locked loops and delay locked loops.

2. Background of the Invention

Digital circuits generally require timing circuits for generating one or more periodic clock signals. Two common types of timing circuits for establishing a stable clock signal are phase locked loops (PLLs) and delay locked loops (DLLs). PLLs and DLLs are most commonly used to synchronize a local clock signal to an incoming clock signal (e.g., from another, external circuit).

Figure 1:
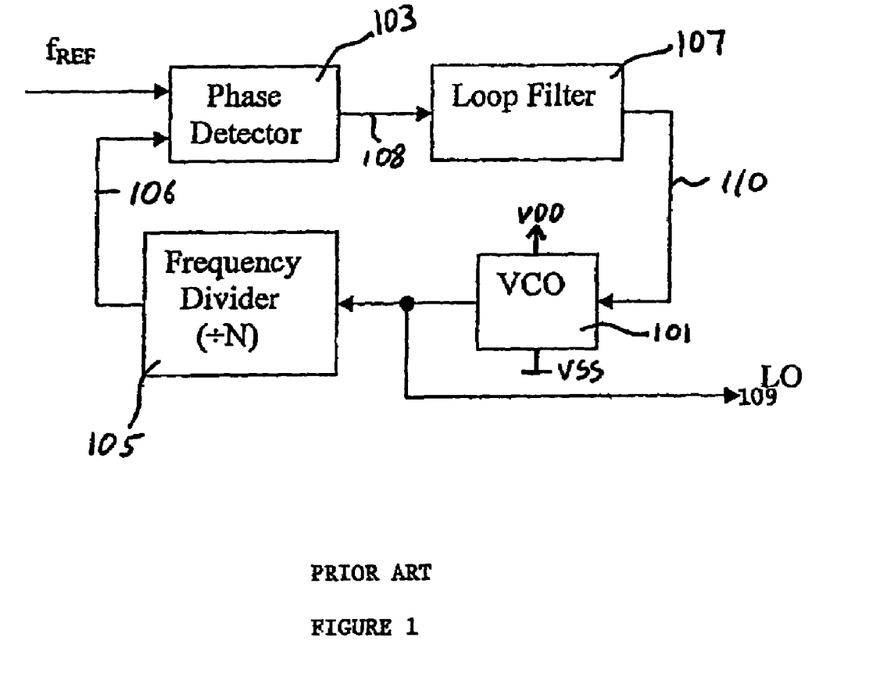
FIG. 1 is a block diagram of a conventional phase locked loop timing circuit.

A PLL typically is a negative feedback system that operates by phase locking to an incoming clock signal and creating a duplicate of the incoming clock or a clock signal that is a multiple of the incoming clock signal (e.g., 2×, 4×, 8×, ½×, ¼× of the incoming clock). FIG. 1 is a simplified block diagram showing the basic components of a PLL. In particular, the incoming clock signal $f_{ref}$ is placed at one input terminal of a phase detector 103. The other input terminal of the phase detector is coupled to a feedback signal 106 to be described in more detail herein below. The output 108 of the phase detector is a signal (e.g., a voltage or a current) that is a function of the difference in phase between the two input signals. Generally, if the two input signals to phase detector 103 are equal, the output is zero. If the incoming clock signal $f_{ref}$ and feedback signal 106 are different in phase, then the phase detector 103 provides output signal 108 that is proportional to the difference of the input signals in both polarity and magnitude. For example, if the phase of the feedback signal 106 is ahead of the phase of the incoming clock signal $f_{ref}$, the phase detector 103 outputs a positive voltage the magnitude of which is proportional to the phase difference. If, on the other hand, the phase of the feedback signal lags the incoming clock signal, then the phase detector outputs a negative voltage, the magnitude of which is proportional to the difference in phase.

The difference signal is passed through a loop filter 107, which generally is a low pass filter that smoothes the difference signal in order to prevent the possibility of the loop becoming unstable for some combinations of high gain at high frequencies and total loop delay beyond some critical value. The output 110 of the loop filter 107 is input to the control terminal of a voltage controlled oscillator (VCO) 101, such as a CMOS ring oscillator, that generates a regular periodic pulse train the frequency of which is a function of the voltage placed at its control input. The output 109 of the VCO 101 may be fed to a frequency multiplier or frequency divider 105 if the VCO frequency range is outside of the frequency range of the incoming clock signal. (Typically, the local oscillator has a frequency range that is multiples higher than the frequency of the incoming clock signal and therefore is divided to generate a signal that is the same frequency as the incoming clock signal with which the PLL is trying to synchronize). The output 109 of the VCO also is the output clock signal of the PLL. It also may be frequency divided or multiplied if the desired output signal is a multiple or divisor of the incoming clock signal. In fact, the several different versions of the output clock signal 109 may be created with the use of one or more frequency dividers or frequency multipliers, if a plurality of clock signals of different frequencies (that are integer multiples of each other) are necessary.

The output of the frequency divider 105 is placed at the second input terminal of the phase detector 103, thus creating a closed loop feedback system in which the circuit will constantly adjust itself to make the two input signals to the phase detector 103 equal in phase, thereby synchronizing the output signal 109 to the incoming clock signal $f_{ref}$. The output of this frequency divider 105 also could be used as a local clock signal if it is at a frequency of interest to the local circuit.

Figure 2:
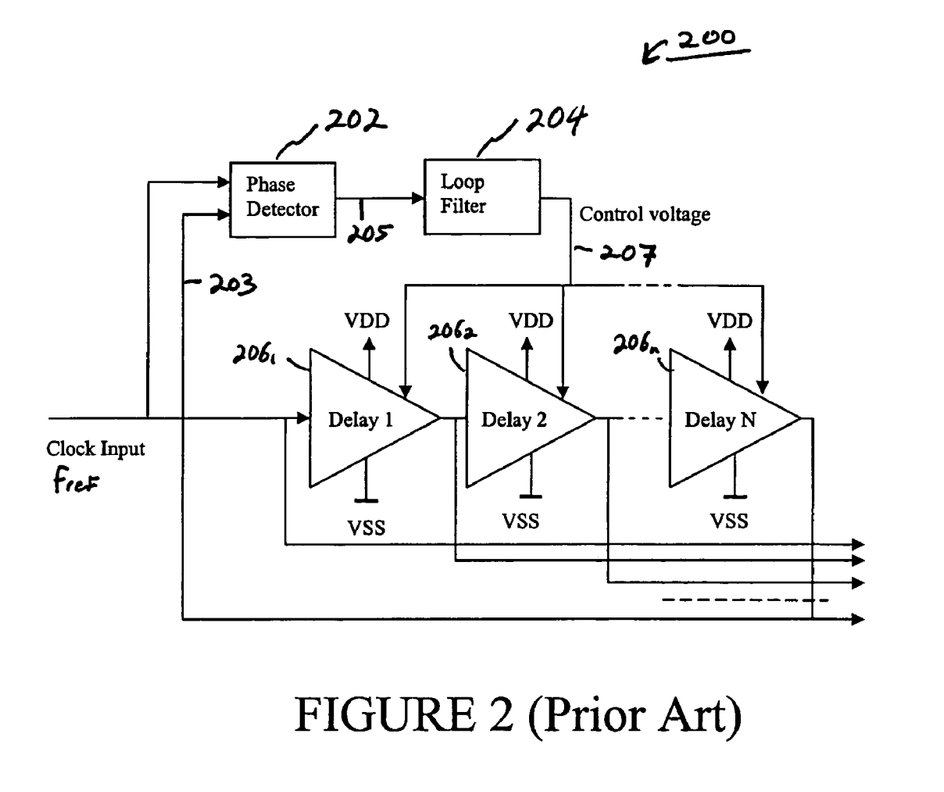
FIG. 2 is a block diagram of a conventional delay locked loop timing circuit.

A DLL also is a closed loop negative feedback system that generates an output signal that is synchronized to an incoming clock signal. However, a DLL generally is used to generate a phase delayed version of the incoming signal clock signal (or multiple/divisor thereof). FIG. 2 is a simplified block diagram of a DLL 200. Again, an input clock signal $f_{ref}$ is input to the first input terminal of a phase detector 202. The second input of the phase detector 202 is coupled to a feedback signal 203 to be described herein below. The phase detector generates a difference signal 205 that is a function of the difference in phase between its two input signals. This difference signal is input to a loop filter 204 as described above in connection with PLLs. The output 207 of the loop filter 204 is coupled to the control inputs of a plurality of delay elements $206_1, 206_2, \ldots, 206_n$, coupled in series. The input terminal of the first delay element $206_1$, receives the incoming reference clock, $f_{ref}$. The output of the last delay element $206_n$ is the feedback signal coupled to the second input terminal of the phase detector 202.

As previously described, the phase detector 205 generates a difference signal proportional (in both polarity and magnitude) to the difference in phase between its two input signals. Accordingly, the DLL also is a negative feedback loop that forces the output of the last delay element to be equal in phase to the incoming clock signal, but delayed exactly one clock cycle of the incoming reference clock signal. By tapping the output of each of the delay elements in the serial chain of delay elements, various phase shifted versions of the incoming reference clock signal are generated. For instance, if there are four delay elements, the output of each delay element will be delayed one quarter of a clock cycle (i.e., 90°) in phase from the preceding delay element. Accordingly, a DLL with four delay elements can generate four clock signals that are synchronized to the incoming reference clock, but phase shifted 90°, 280°, 270° and 360°, respectively. Of course, the 360° shifted signal is the exactly in phase with the incoming reference clock signal (just delayed exactly one clock cycle). Alternately, an inverter can be added anywhere in the chain of delay elements to introduce a 180 phase shift. By doing so, the total delay through the chain will lock at half a clock period rather than a whole clock period. Thus, for example, if there are four delay elements and an inverter in the chain, the delays provided at each tap will be 45°, 90°, 135°, and 180°. This implementation is attractive when all clocks are supposed to have a duty cycle very close to 50%. Although not expressly illustrated for all of the blocks in FIGS. 1 and 2, of course, all of the circuitry in either the exemplary PLL of DLL must be coupled to a power supply in order for the circuit to operate (i.e., be coupled between ground and a power rail). The source of power is illustrated only for the delay elements in FIG. 2 for purposes of example and discussion. Each delay element, of course, is coupled between a supply voltage VDD and ground VSS.

If the power supply fluctuates (i.e., the voltage between VDD and VSS fluctuates), the amount of delay provided by the delay circuits also will fluctuate. Generally, if the voltage on VDD increases, the delay elements will be faster (i.e., will generate a smaller delay) and vice versa. The negative feedback loop of a PLL or DLL will, of course, compensate and readjust timing in response to any such fluctuations, but there will be a temporary jitter in the output(s) of the PLL or DLL. Also, there is a maximum frequency of fluctuations to which a negative feedback loop such as a PLL or DLL can react. If the fluctuations in the power supply (or changes in the incoming reference clock) exceed a certain frequency, the loop cannot react quickly enough, resulting in some instantaneous error. Some time later (depending on the limited speed of the feedback loop) the loop will gradually correct this instantaneous error, until it becomes very small. The maximum speed of a PLL or DLL will largely be dictated by the propagation delay through the circuit elements of the PLL or DLL.

Since accurate timing and synchronization to an external clock typically is critical to the proper operation of digital circuits, great efforts are made to minimize timing jitter, including timing jitter caused by power supply fluctuations. Most efforts to minimize timing jitter caused by power supply fluctuations focus on reducing power supply voltage noise and ripple. Such efforts include the use of precision regulators to regulate the power supply, the use of passive filters to clean up the output of the power supply, and the use of dedicated power supply pads/pins pairs for the timing circuits. Each of these solutions, however, is expensive in one way or another. For instance, regulators require significant circuit area to implement and are power-hungry. Passive filters also require significant circuit area to fabricate. The use of dedicated power supplied pads/pins is expensive and requires a significant amount of circuit area.

Accordingly, it is an object of the present invention to provide an improved timing circuit.

It is another object of the present invention to provide an improved phase locked loop.

It is a further object of the present invention to provide an improved delay locked loop.

It is yet one more object of the present invention to provide a timing circuit with reduced jitter.

It is yet a further object of the present invention to provide a timing circuit with a feed forward cancellation of jitter induced by power supply noise.

It is another object of the present invention to provide timing circuit with reduced sensitivity of jitter to power supply noise.

SUMMARY OF THE INVENTION

In accordance with the invention, feed forward compensation of power supply jitter is incorporated into the negative feedback control loop of a timing synchronization circuit, such as a phase locked loop or delay locked loop. More particularly, the dependence of the circuitry in the negative feedback loop, such as the delay elements in a DLL or the oscillator in a PLL, to fluctuations in the power supply are counteracted by introducing into the feedback loop a signal component that is a function of the supply voltage and that will have the opposite effect from any direct fluctuations in the power supply voltage.

In accordance with one particular embodiment of the invention, if the ratio of the dependence of the negative feedback loop on the supply voltage relative to the dependence of the negative feedback loop on the control voltage is less than one and of opposite polarity, then VDD can be appropriately introduced into the feedback loop by coupling VDD into the control signal (the signal that is coupled to the control inputs of the delay elements in a DLL or the signal that is coupled to the control input of the VCO in a PLL) through a split capacitor arrangement coupled between VDD, the control signal line and VSS (ground). For instance, if the ratio of the dependence of the timing circuit on VDD is one half of the dependence of the control loop on the control signal (e.g., the output of the loop filter in FIGS. 1 and 2), then a split capacitor comprising two identical capacitors coupled between VDD, the control signal line and VSS will cancel out any voltage jitter in the power supply (i.e., VDD). As another example, if the ratio between the timing circuit's dependence on VDD and the dependence on the control signal is equal to or very close to one, then there need be no capacitor at all between ground and the control line such that the compensation circuit could simply comprise a single capacitor coupled between the control line and VDD.

For negative feedback loops in which the ratio between the dependence on VDD and the dependence on the control voltage is greater than one and/or not of opposite polarity, the concepts of the present invention still work, but a more complicated compensation circuit would be necessary.

DETAILED DESCRIPTION OF THE INVENTION

Figure 3:
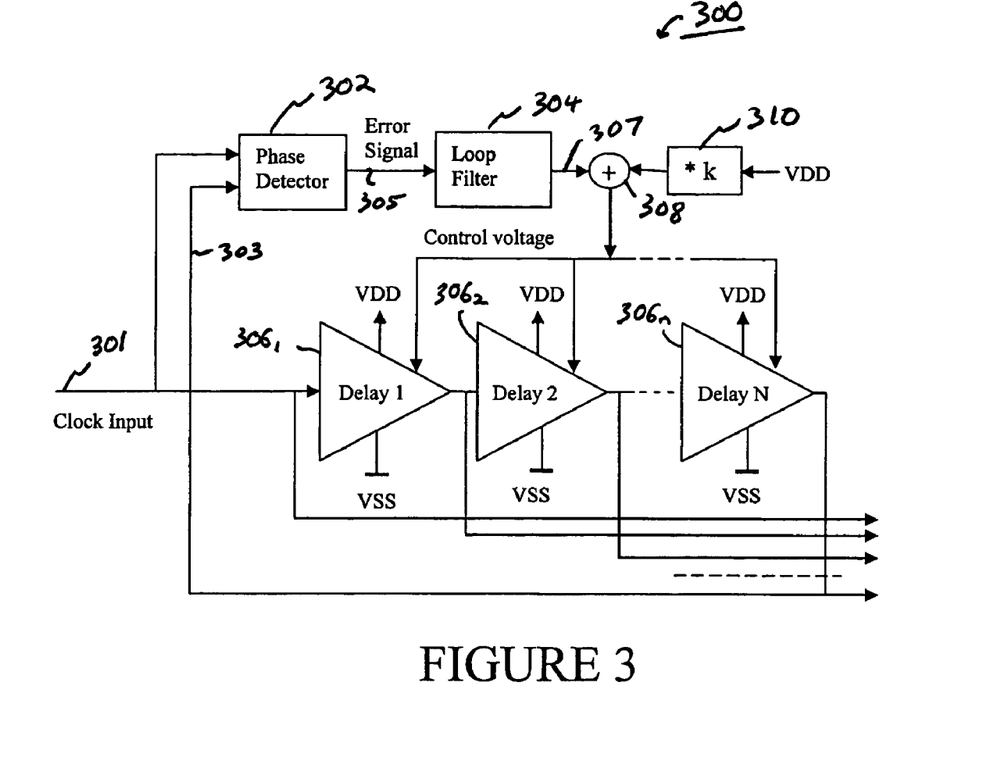
FIG. 3 is a block diagram of a delay locked loop in accordance with the present invention.

FIG. 3 is a block diagram of a DLL 300 in accordance with the principles of the present invention. As is conventional, a reference clock 301 is input to the first input terminal of a phase detector 302. The other input terminal of the phase detector is coupled to the negative feedback signal 303. The phase detector generates a difference signal 305 that is a function of the difference in phase between its two input signals. This difference signal is input to a loop filter 304. The output 307 of the loop filter 304 is coupled through one input terminal of a summing circuit 308 to the control inputs of a plurality of delay elements $306_1, 306_2, \ldots, 306_n$ coupled in series. The input terminal of the first delay element $306_1$, receives the incoming reference clock 301. The output of the last delay element $306_N$ is the feedback signal 303 that is coupled to the second input terminal of the phase detector 302. In some implementations, an increase in the control voltage to a delay element increases the delay provided by the delay element, while a decrease in the control voltage results in a decrease in the delay provided by the delay element. In this case, the gain of the delay elements is said to be positive. In other implementations the gain could be negative.

As previously described, the phase detector 302 generates a difference signal proportional (in both polarity and magnitude) to the difference in phase between its two input signals. That signal, after being filtered by the loop filter 304, is the control signal into the delay elements $306_1$, $306_2$, ..., $306_n$. The output of each delay element is tapped to provide an output signal that is a delayed version of the input reference clock. As previously described, by tapping the output of each of the delay elements in the series chain of delay elements, various phase shifted versions of the incoming reference clock signal are generated.

The circuitry in the DLL receives power from a power supply. The power scheme is shown only with respect to the delay elements $306_1$, $306_2$, ..., $306_N$. Particularly, each delay element is coupled between VDD and VSS. VSS typically will be circuit ground.

As previously noted, the circuitry in the DLL, and particularly the delay elements $306_1$, $306_2$, ..., $306_n$, are affected by changes in the voltage differential between VDD and VSS. Very often, an increase in this voltage differential will cause the delay elements to operate faster. The feedback loop normally will compensate for the change and cause the feedback signal to again become phase synchronized with the input clock signal, but it will take a finite period of time to do so. Thus, a fluctuation in the power supply that increases the voltage differential between VDD and VSS will momentarily alter the balance of the feedback loop, thus causing timing jitter. Depending on the magnitude of the timing jitter and the precision required by the particular circuit, the timing jitter could cause problems in the operation of the overall circuit which is being clocked by the DLL. Furthermore, if the fluctuations in the power supply are very high frequency (e.g., faster than the propagation delay through the feedback loop), it could actually cause the feedback loop to amplify the effect of the jitter caused by power supply disturbances.

The present invention provides a feedforward compensation technique that compensates for fluctuations in the power supply before they have any effect on the operation of the negative feedback loop. Particularly, in accordance with the invention, VDD is scaled in a scaling circuit 310 and added to the control voltage through adder 308. the scaling factor k of the scaling circuit 310 should be set to the ratio between the increase in delay provided by each delay circuit as a function of a given increase in voltage of the control signal (this is called the "gain" of the delay elements) versus the decrease in delay of each delay element as a function of the same given increase in VDD. In this manner, any instantaneous increase (or decrease) in VDD will result in an essentially almost equally instantaneous decrease (or increase) in the control voltage input to the delay elements. (There is a small propagation delay through the scaling circuit 310). By providing the appropriate scaling factor k as described above, the resultant increase in the control voltage to the delay elements will exactly cancel the effect on the delay provided by the delay elements of the increase in VDD.

Merely as an example, if a 1 mV increase in the control signal results in a 15 pico second increase in the delay provided by each delay element whereas in 1 mV increase in VDD supplied to each delay element results in a 5 pico second decrease in the delay provided by each delay element, then the scaling factor k should be ⅓. If, on the other hand, the effects of voltage changes in the control voltage and voltage changes in VDD on the delay provided by the delay elements were equal, e.g., a 1 mV increase in the control signal results in a 5 pico second increase in the delay provided by each delay element and a 1 mV increase in VDD supplied to each delay element also results in a 5 pico second decrease in the delay provided by each delay element, then the scaling factor k should be 1.

In a situation in which the appropriate scaling factor is one, VDD could simply be coupled directly to the control voltage with no intervening circuitry (and therefore no propagation delay to worry about).

Figure 4:
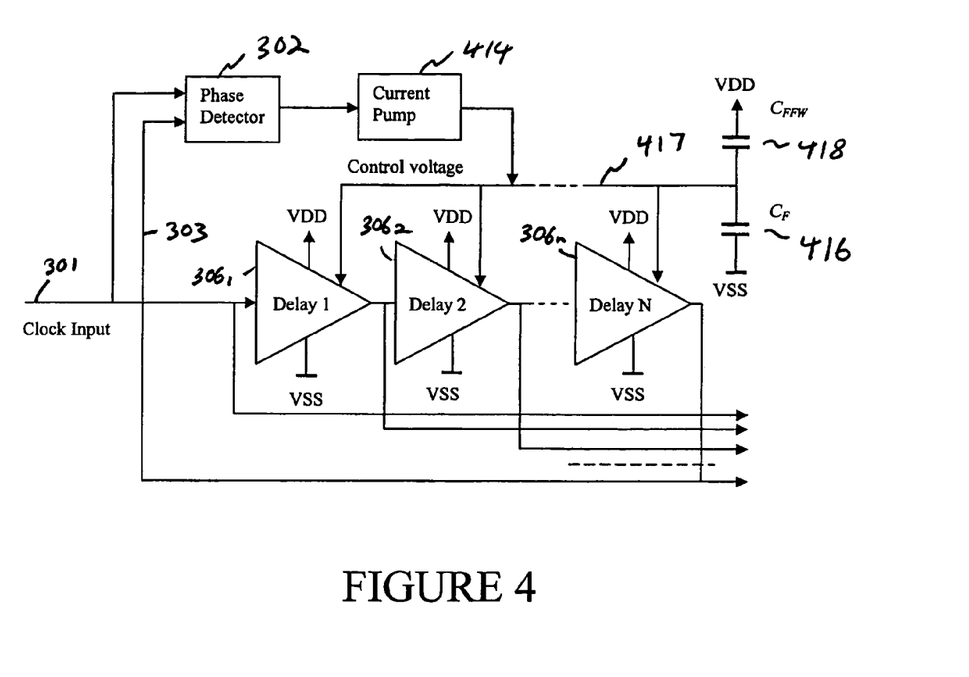
FIG. 4 is a block diagram of a first particular implementation of a delay locked loop in accordance with the present invention.

FIG. 4 is a block diagram of a practical implementation in accordance with the principles of the present invention. In FIG. 4, the phase detector 302 and delay element chain $306_1$, $306_2$, ..., $306_n$ are the same as in FIG. 3. FIG. 4, however, illustrates a practical embodiment of the loop filter 304. In this particular embodiment, the output signal of the phase detector is a pulse train. This is a common implementation of a phase detector used in a PLL or DLL. More particularly, when the two input signals to the phase detector are very close in phase, the pulses are very narrow (nearly vanishing) and of alternating polarity. For phase differentials in one direction, pulses of a first polarity tend to vanish, while the pulses of the second polarity become gradually wider and wider as the phase shift between the two signals becomes larger. For phase differentials in the other direction, pulses of the second polarity tend to vanish, while the pulses of the first polarity become gradually wider and wider as the phase shift between the two signals becomes larger in that direction. Thus, if the two signals are not in phase, the phase detector outputs a negative pulse train if the feedback signal lags the input reference clock signal or outputs a positive pulse train if the feedback signal leads the input reference clock signal. Accordingly, the polarity of the pulse train indicates the direction of offset between the feedback signal and the reference signal. The magnitude of the offset is represented by the duty cycle of the pulse train (i.e., the width of the pulses). With this type of output signal from the phase detector 302, the loop filter can comprise a current pump 414 and a capacitor pair 416, 418. Particularly, the current pump 414 is coupled between the phase detector 302 and the control inputs of the delay elements $306_1$, $306_2$, ... $306_n$ and converts the voltage pulses from the phase detector 302 into current pulses. The loop filter further comprises a capacitor 416 coupled between the control line and ground. In effect, the capacitor integrates the pulse train produced by the current pump such that the delay elements received a smoothly varying control voltage, the value of which is proportional to the signal generated by the phase detector and therefore is proportional to the difference in phase between the input reference clock and the feedback signal.

In accordance with the principles of the invention, a scaled version of VDD is introduced on to the control voltage signal line 417 by adding an appropriately scaled capacitor 418 between the control voltage line 417 and VDD. This is a very elegant solution in that changes in VDD are instantaneously compensated for by an appropriately scaled instantaneous change in the control voltage of the delay elements. Since the control voltage is smoothed by the filter capacitor 416, the addition of the scaling capacitor 418 results in little or no propagation delay in the instantaneous compensation for variations in VDD.

The scaling factor k in the embodiment shown in FIG. 4 is:

$$k = C_{FFW}/(C_{FFW} + C_F)$$

Thus, for instance, if the effect of changes in VDD on timing is half the effect of changes in the control voltage, then the scaling factor k would need to be ½. Thus, the capacitances CFFW and CF of capacitors 418 and 416, respectively, would be of equal value.

Figure 5:
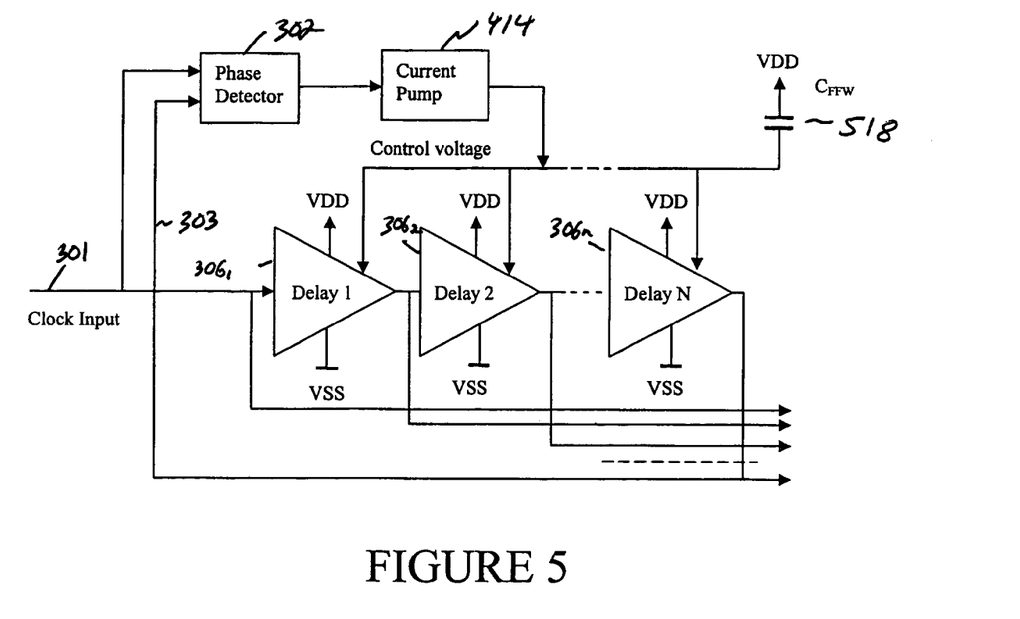
FIG. 5 is a block diagram of another particular embodiment of a delay locked loop in accordance with the present invention that can be employed under certain specific conditions.

If, on the other hand, the effects of changes in VDD were equal to the effect of changes in the control voltage, then the scaling factor k would be 1. In this unique situation, which is illustrated in FIG. 5, the filter capacitor 416, which would normally be provided in this circuit even absent implementation of the present invention, might be eliminated. This would leave just a single capacitor 518 coupled between VDD and the control voltage line 517.

The elegant solutions illustrated in FIGS. 4 and 5 are particularly suited for situations in which (1) the effect of VDD on the delay provided by the delay element is smaller than or equal to the effect of the control voltage on the delay provided by the delay elements, i.e., the scaling factor k is less than or equal to one and (2) the direction of the effect of VDD on the delay is the opposite of the direction of the effect of the control voltage on the delay.

As noted above, increases in the power supply voltage will generally result in a circuit operating faster, and thus, a decrease in the delay provided by the delay elements. On the other hand, however, a DLL might be designed such that an increase in the control voltage causes a decrease in the delay provided by the delay elements. In such a circuit, either one of the control voltage or the scaling factor is inverted relative to the other. Although easy to implement, the inverting circuit might add propagation delay into the mix, modifying operation performance of the feedforward compensation.

Likewise, if the scaling factor k needs to be greater than one, i.e., if the effect of changes in VDD are greater than the effect of changes in the control voltage, then the scaling circuit might not be implemented by a simple capacitor, but would include an amplifier.

Figure 6:
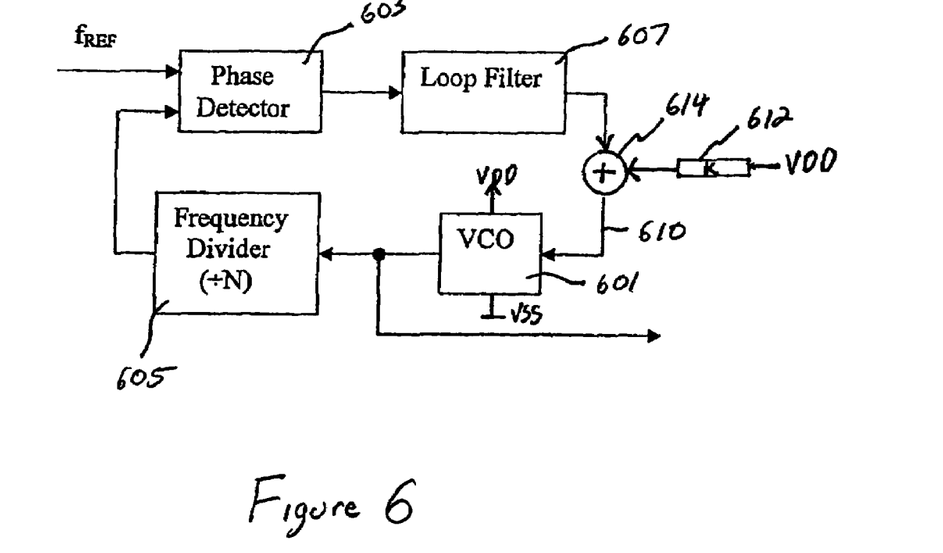
FIG. 6 is a block diagram of a phase locked loop in accordance with the present invention.

FIG. 6 is a block diagram of a PLL embodying the principles of the present invention. The circuit is largely identical to the conventional circuit illustrated by FIG. 1. However, in addition to a phase detector 603, loop filter 607, VCO 601, and frequency divider 605, a scaled version of VDD is added into the control voltage line 610. FIG. 6 illustrates this by additional circuitry comprising a scaling circuit 612 for generating a scaled version of VDD and an adder 614 for adding the output of the scaling circuit 612 into the control voltage line.

Solutions similar to those specifically illustrated by the DLL embodiments of FIGS. 4 and 5 are equally applicable in the PLL circuit of FIG. 6.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

What is claimed is:

1. A timing circuit for generating an output clock signal synchronized to a reference clock signal, comprising:
    a detector for detecting a difference between said reference clock signal and a feedback signal and generating a control signal proportional to said difference, said detector coupled to receive said reference clock signal at a first input terminal and said feedback signal at a second input terminal;
    a scaling circuit coupled to combine a scaled version of said power supply with said control signal to generate a scaling signal;
    a feedback circuit coupled to a power supply and said detector, said feedback circuit adapted to generate said feedback signal having a phase that is a function of said scaling signal.

2. The timing circuit of claim 1 wherein said scaling circuit has a scaling factor equal to the ratio between (a) an effect of variations in said control signal on the feedback signal and (b) effect of variations in the power provided by said power supply to said feedback circuit on the feedback signal.

3. The timing circuit of claim 1 wherein said timing circuit is a delay locked loop.

4. The timing circuit of claim 3 wherein:
    said power supply generates a voltage differential between first and second power terminals;
    said feedback circuit comprises a plurality of delay elements coupled in series between said reference clock signal and said feedback signal; and
    said scaling circuit comprises a first and second capacitors, said first capacitor coupled between said first power terminal and said control voltage and said second capacitor coupled between said control voltage and said second power terminal.

5. The timing circuit of claim 3 wherein:
    said power supply generates a voltage differential between first and second power terminals;
    said feedback circuit comprises a plurality of delay elements coupled in series between said reference clock signal and said feedback signal; and
    said scaling circuit comprises a capacitor coupled between said first power terminal and said control voltage.

6. The timing circuit of claim 1 wherein said timing circuit is a phase locked loop.

7. The timing circuit of claim 6 wherein:
    said power supply generates a voltage differential between first and second power terminals;
    said feedback circuit comprises a voltage controlled oscillator; and
    said scaling circuit comprises a first and second capacitors, said first capacitor coupled between said first power terminal and said control voltage and said second capacitor coupled between said control voltage and said second power terminal.

8. The timing circuit of claim 6 wherein:
    said power supply generates a voltage differential between first and second power terminals;
    said feedback circuit comprises a voltage controlled oscillator; and
    said scaling circuit comprises a capacitor coupled between said first power terminal and said control voltage.

9. A method for generating an output clock signal synchronized to a reference clock signal with improved isolation from power supply jitter, said method comprising the steps of:
    (1) detecting a difference between said reference clock signal and a feedback signal;
    (2) generating a control signal proportional to said difference;

(3) providing a voltage for powering said feedback circuit;

(4) generating a scaled version of said power voltage;

(5) adding said scaled version of said power voltage to said control signal to generate a scaling; and (6) generating said feedback signal, said feedback signal having a phase that is a function of said scaling signal.

10. The method of claim 9 wherein step (5) comprises scaling said power voltage by a scaling factor equal to the ratio between (a) an effect of variations in said control signal on the feedback signal and (b) effect of variations in the power voltage on the feedback signal.

11. The method of claim 9 wherein step (3) comprises generating at least one phase delayed version of said reference clock signal by passing said reference clock signal through a series chain of delay elements to generate said feedback signal at a last one of said delay elements.

12. The method of claim 11 wherein said voltage for powering said feedback circuit is provided between first and second power terminals, wherein:

step (3) comprises generating at least one phase delayed version of said reference clock signal by passing said reference clock signal through a series chain of delay elements to generate said feedback signal at a last one of said delay elements; and step (5) comprises coupling said control signal to said first power terminal through a first capacitor and coupling said control signal to said second power terminal through a second capacitor.

13. The method of claim 11 wherein said voltage for powering said feedback circuit is provided between first and second power terminals:

step (3) comprises generating at least one phase delayed version of said reference clock signal by passing said reference clock signal through a series chain of delay elements to generate said feedback signal at a last one of said delay elements; and step (5) comprises coupling said control signal to said first power terminal through a first capacitor.

14. The method of claim 9 wherein step (3) comprises generating a local oscillator signal having a frequency that is a function of said control signal, said feedback signal being proportional to said local oscillator signal.

15. The method of claim 9 wherein said voltage for powering said feedback circuit is provided between first and second power terminals, wherein:

step (3) comprises generating a local oscillator signal having a frequency that is a function of said control signal, said feedback signal being proportional to said local oscillator signal; and step (5) comprises coupling said control signal to said first power terminal through a first capacitor and coupling said control signal to said second power terminal through a second capacitor.

16. The method of claim 9 wherein said voltage for powering said feedback circuit is provided between first and second power terminals, wherein:

step (3) comprises generating a local oscillator signal having a frequency that is a function of said control signal, said feedback signal being proportional to said local oscillator signal; and step (5) comprises coupling said control signal to said first power terminal through a first capacitor.

* * * * *